US010962657B2

(12) United States Patent
Yamane (10) Patent No.: US 10,962,657 B2
(45) Date of Patent: Mar. 30, 2021

(54) SUPERCONDUCTING ELEMENT, PARTICLE DETECTION DEVICE, AND PARTICLE DETECTION METHOD

(71) Applicant: TOSHIBA MEMORY CORPORATION, Tokyo (JP)

(72) Inventor: Takeshi Yamane, Tsukuba Ibaraki (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/459,736

(22) Filed: Jul. 2, 2019

(65) Prior Publication Data

US 2020/0011999 A1 Jan. 9, 2020

(30) Foreign Application Priority Data

Jul. 4, 2018 (JP) .............................. JP2018-127831

(51) Int. Cl.
*G01T 1/16* (2006.01)
*G01T 3/00* (2006.01)
(Continued)

(52) U.S. Cl.
CPC ........ *G01T 1/16* (2013.01); *G01J 1/42* (2013.01); *G01T 3/00* (2013.01); *H01J 37/244* (2013.01); *H01J 37/261* (2013.01)

(58) Field of Classification Search
USPC ....................................................... 250/307
See application file for complete search history.

(56) References Cited

U.S. PATENT DOCUMENTS 4,037,102 A * 7/1977 Hoyle .................... G11C 11/44
250/336.1
4,135,091 A * 1/1979 Lanza ................... G01T 1/1606
250/336.2
(Continued)

FOREIGN PATENT DOCUMENTS

JP 5027965 B2 9/2012
JP 2017-9372 A 1/2017

OTHER PUBLICATIONS

Fukuda et al., "Superconducting Single Photon Detectors," The Journal of the Institute of Electronics, Information and Communication Engineers (Aug. 2007), 90:674-679.
(Continued)

*Primary Examiner* — Phillip A Johnston
(74) *Attorney, Agent, or Firm* — Finnegan, Henderson, Farabow, Garrett & Dunner LLP (57) ABSTRACT

According to one embodiment, a superconducting element used as a pixel for detecting a particle is disclosed. The superconducting element includes at least one superconducting strip. The at least one superconducting strip includes a meandering structure. The meandering structure includes a first portion extending in a first direction and made of a superconducting material, a second portion connected to the first portion, extending in a second direction perpendicular to the first direction, and being conductive, and a third portion connected to the second portion, extending in a direction opposite to the first direction, and made of a superconducting material. A superconducting region of any one of the first portion and the third portion is configured to be divided when the particle is radiated to the first portion.

20 Claims, 4 Drawing Sheets

(51) Int. Cl.
*H01J 37/26* (2006.01)
*H01J 37/244* (2006.01)
*G01J 1/42* (2006.01)

(56) References Cited

U.S. PATENT DOCUMENTS

| | | | | |
|---|---|---|---|---|
| 4,873,482 | A * | 10/1989 | Gray | G01T 1/1606 |
| | | | | 324/71.4 |
| 6,812,464 | B1 * | 11/2004 | Sobolewski | H01L 39/10 |
| | | | | 250/336.2 |
| 10,067,239 | B2 * | 9/2018 | Nelson | G01T 1/1611 |
| 10,505,094 | B2 * | 12/2019 | Sunter | G01J 1/42 |
| 10,665,634 | B2 * | 5/2020 | Zhao | H01L 23/66 |
| 2018/0188107 | A1 | 7/2018 | Zen et al. | |

OTHER PUBLICATIONS

Inderbitzin et al., "Soft X-Ray Single-Photon Detection With Superconducting Tantalum Nitride and Niobium Nanowires," IEEE Transactions on Applied Superconductivity (Dec. 12, 2012), 23:1-5.

\* cited by examiner

SUPERCONDUCTING ELEMENT, PARTICLE DETECTION DEVICE, AND PARTICLE DETECTION METHOD

CROSS-REFERENCE TO RELATED APPLICATIONS

This application is based upon and claims the benefit of priority from Japanese Patent Application No. 2018-127831, filed Jul. 4, 2018, the entire contents of which are incorporated herein by reference.

FIELD

Embodiments described herein relate generally to a superconducting element, a particle detection device, and a particle detection method.

BACKGROUND

An X-ray photon detection device employing a narrow strip made of a superconducting material (superconducting strip) has been known. When detecting an X-ray photon, a bias current is supplied to the superconducting strip in a superconducting state. When the X-ray photon collides with the superconducting strip in this state, a temporal transition to a non-superconducting state arises in the vicinity of a region with which the X-ray photon collides, and thus a pulsed electrical signal is generated. The pulsed electrical signal is detected to count the number of X-ray photons.

DETAILED DESCRIPTION

In general, according to one embodiment, a superconducting element used as a pixel for detecting a particle is disclosed. The superconducting element includes at least one superconducting strip. The at least one superconducting strip includes a meandering structure. The meandering structure includes a first portion extending in a first direction and made of a superconducting material; a second portion connected to the first portion, extending in a second direction perpendicular to the first direction, and being conductive; and a third portion connected to the second portion, extending in a direction opposite to the first direction, and made of a superconducting material. A superconducting region of any one of the first portion and the third portion is configured to be divided when the particle is radiated to the first portion.

Embodiments will be described hereinafter with reference to the accompanying drawings. The drawings are schematic or conceptual drawings, and dimensions and ratios are not necessarily the same as those in reality. Further, in the drawings, the same reference symbols (including those having different subscripts) denote the same or corresponding parts, and overlapping explanations thereof will be made as necessary. In addition, as used in the description and the appended claims, what is expressed by a singular form shall include the meaning of "more than one".

First Embodiment

Figure 1:
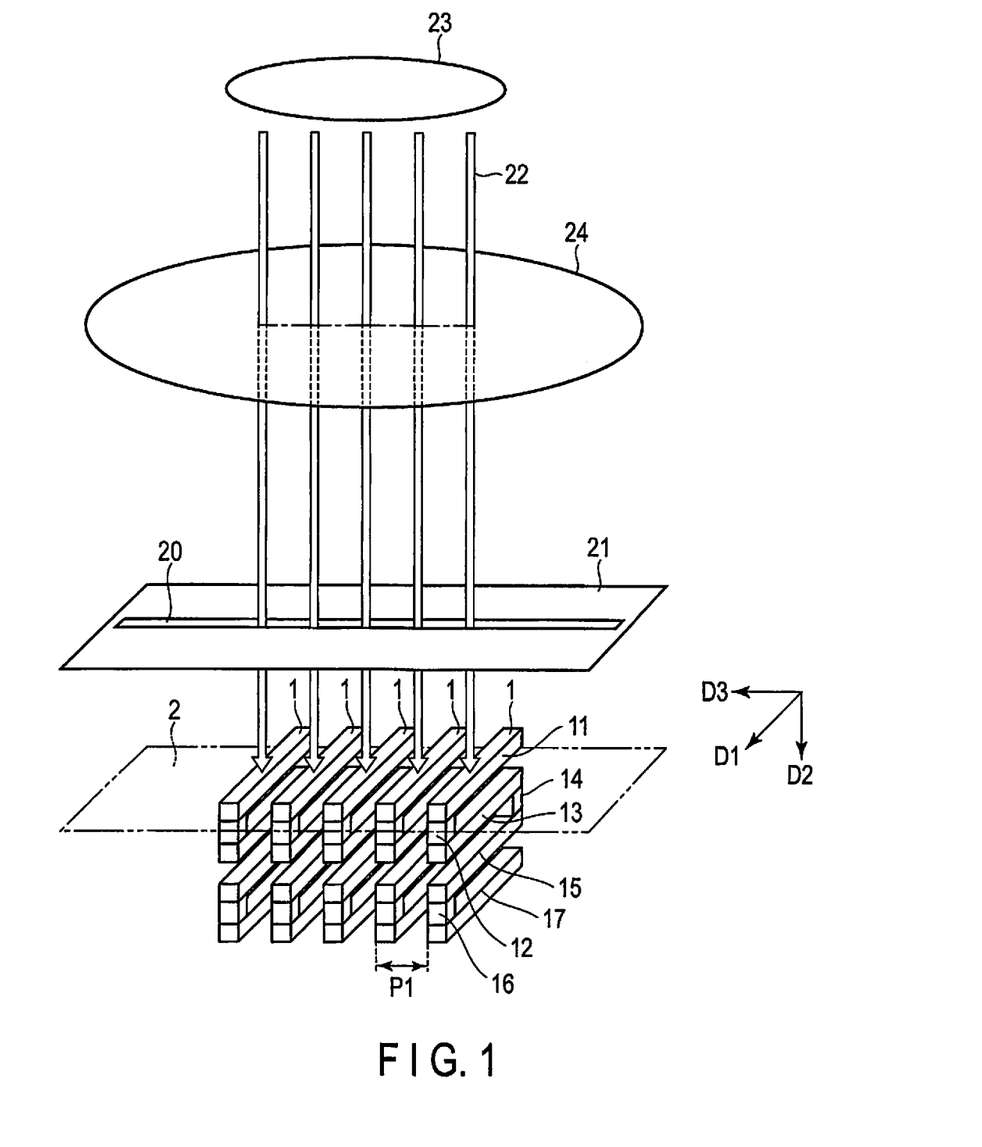
FIG. 1 is a perspective view showing a schematic structure of a particle detection device according to a first embodiment.

FIG. 1 is a perspective view showing a schematic structure of a particle detection device according to a first embodiment. In the present embodiment, description is given for a case where the particle detection device detects an X-ray photon, which is an example of a particle.

The particle detection device of the present embodiment comprises a plurality of superconducting strips 1 (superconducting elements) made of superconducting materials. Each of the superconducting strips 1 has a meandering structure. Each of the superconducting strips 1 includes a first portion 11, a second portion 12, a third portion 13, a fourth portion 14, a fifth portion 15, a sixth portion 16, and a seventh portion 17, which constitute the meandering structure. When an X-ray photon is radiated to the first portion 11, a state in which a superconducting region of the first portion 11, the third portion 13, the fifth portion 15, or the seventh portion 17 is divided arises. In FIG. 1, the first portion 11 to the seventh portion 17 have the shape of a rectangular parallelepiped, but may have other shapes. The first portion 11 to the seventh portion 17 will be further described hereinafter.

The first portion 11 extends in a first direction D1. The first portion 11 is provided on a surface (substrate surface) 2 of a substrate (not shown), and the substrate surface 2 corresponds to a detection surface. The second portion 12 is connected to the first portion 11, and extends in a second direction D2, which is perpendicular to the first direction D1. The second direction D2 is also perpendicular to the substrate surface 2.

The third portion 13 is connected to the second portion 12, and extends from the second portion 12 in a direction opposite to the first direction D1. The fourth portion 14 is connected to the third portion 13, and extends in the second direction D2.

The fifth portion 15 is connected to the fourth portion 14, and extends from the fourth portion 14 in the first direction D1. The sixth portion 16 is connected to the fifth portion 15, and extends in the second direction D2. The seventh portion 17 is connected to the sixth portion 16, and extends from the sixth portion 16 in the direction opposite to the first direction D1.

The first portion 11, the third portion 13, the fifth portion 15, and the seventh portion 17 overlap with respect to the second direction D2. In other words, when the superconducting strips 1 are seen from above, the first portion 11, the third portion 13, the fifth portion 15, and the seventh portion 17 overlap each other.

The dimensions in the first direction D1 of the first portion 11, the third portion 13, the fifth portion 15, and the seventh portion 17 are greater than the dimensions in the second direction D2 of the second portion 12, the fourth portion 14, and the sixth portion 16. In addition, the dimensions in a third direction D3 of the first portion 11 to the seventh portion 17 are equal to each other.

The superconducting strips 1 are arranged at an optional pitch P1 in the third direction D3 without contacting each other. As shown in FIG. 1, the third direction D3 is a direction perpendicular to the first direction D1 and the second direction D2.

Although FIG. 1 shows the five superconducting strips 1, two, three, four, six or more superconducting strips 1 may be employed.

A well-known material can be selected as appropriate as the materials of the superconducting strips 1. As in the case of a material including tantalum, the greater the absorptance of X-rays is, the greater the detection efficiency of X-ray photons is.

The first portion 11, the third portion 13, the fifth portion 15, and the seventh portion 17 are used as main portions for detecting the X-ray photon, and include the superconducting materials. The second portion 12, the fourth portion 14, and the sixth portion 16 are, respectively, a conductive portion for electrically connecting the first portion 11 and the third portion 13, a conductive portion for electrically connecting the third portion 13 and the fifth portion 15, a conductive portion for electrically connecting the fifth portion 15 and the seventh portion 17. Consequently, the second portion 12, the fourth portion 14, and the sixth portion 16 need not be superconducting materials, as long as the second portion 12, the fourth portion 14, and the sixth portion 16 function as the conductive portions. For example, an ordinary conductive material (for example, a non-superconducting material such as gold) may be used for the second portion 12, the fourth portion 14, and the sixth portion 16. Therefore, in the present specification, all portions of the superconductive strip are not necessarily required to be made of the superconducting material. When the second portion 12, the fourth portion 14, and the sixth portion 16 are superconducting materials, the first portion 11 to the seventh portion 17 can be made of the same superconducting material, thereby facilitating a manufacturing of the superconducting strip 1.

In the substrate under the substrate surface 2, an insulator (not shown) is provided between the superconducting strips 1. It is preferable that the insulator have extremely high transmissivity of X-rays as in the case of silicon dioxide.

The particle detection device further comprises a slit portion 21 that is disposed above the superconducting strips 1 (in a direction opposite to the second direction D2) and comprises a slit 20. The longitudinal direction of the slit 20 is the third direction D3. As seen from above the slit portion 21, the slit 20 crosses the five superconducting strips 1 with respect to the third direction D3.

The particle detection device further comprises an X-ray generator 23 that is disposed above the slit portion 21 (in the direction opposite to the first direction D1) and generates an X-ray 22. It should be noted that the X-ray generator 23 may not be included as a part of the particle detection device. In this case, when detecting an X-ray photon, the X-ray generator 23 is prepared separately from the particle detection device.

Figure 2:
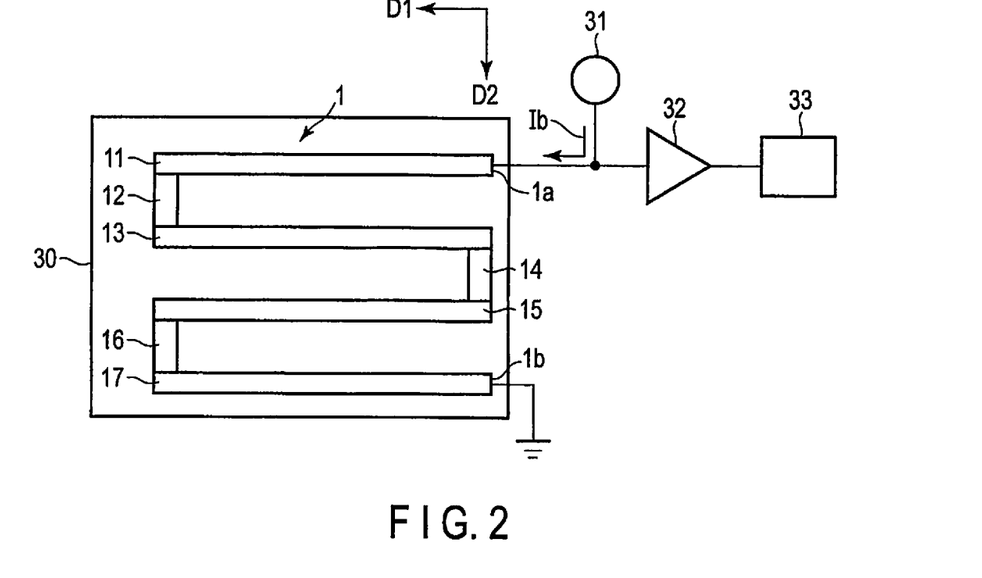
FIG. 2 is a diagram schematically showing a current source, an amplifier, and a measuring instrument connected to a superconducting strip of the particle detection device.

As shown in FIG. 2, the particle detection device further comprises a current source 31 connected to one end 1a of each of the superconducting strips 1. The current source 31 supplies a bias current Ib to the superconducting strips 1. The bias current Ib is smaller than the critical current of the superconducting materials of the superconducting strips 1. The other end 1b of each of the superconducting strips 1 is connected to ground. It should be noted that the current source 31 may not be included as a part of the particle detection device. In this case, when detecting the X-ray photon, the current source 31 is prepared separately from the particle detection device.

The particle detection device further comprises an amplifier 32 connected to the one end 1a of each of the superconducting strips 1. The amplifier 32 amplifies an electrical signal generated in the superconducting strips 10. It should be noted that the amplifier 32 may not be included as a part of the particle detection device. In this case, when detecting the X-ray photon, the amplifier 32 is prepared separately from the particle detection device.

The particle detection device further comprises a measuring instrument 33 for monitoring an electrical signal, which is connected to the amplifier 32. More details are as follows.

When an X-ray photon is radiated to the first portion 11 in a superconducting state, the X-ray photon is absorbed in the first portion 11 or transmitted through the first portion 11. When the X-ray photon is transmitted through the first portion 11, the X-ray photon is radiated to and absorbed in the third portion 13, the fifth portion 15, or the seventh portion 17, which is located under the first portion 11. A superconducting region of a superconducting strip (the first portion 11, the third portion 13, the fifth portion 15, or the seventh portion 17) in which the X-ray photon is absorbed is divided. Thus, detecting the state in which the superconducting region of the superconducting strip is divided (divided state) corresponds to detecting the X-ray photon. Here, when the divided state arises, the superconducting strip in which the X-ray photon is absorbed generates an electrical signal (for example, a pulsed electrical signal). Accordingly, the X-ray photon can be detected by detecting the electrical signal by using the measuring instrument 33.

It should be noted that the measuring instrument 33 may not be included as a part of the particle detection device. In this case, when detecting the X-ray photon, the measuring instrument 33 is prepared separately from the particle detection device.

The superconducting strips 1 are cooled down to the critical temperature or less by an optional refrigerator (not shown) so as to maintain the superconducting state. The refrigerator may not be included in the particle detection device as in the case of the current source 31, the amplifier 32, etc.

Figure 7:
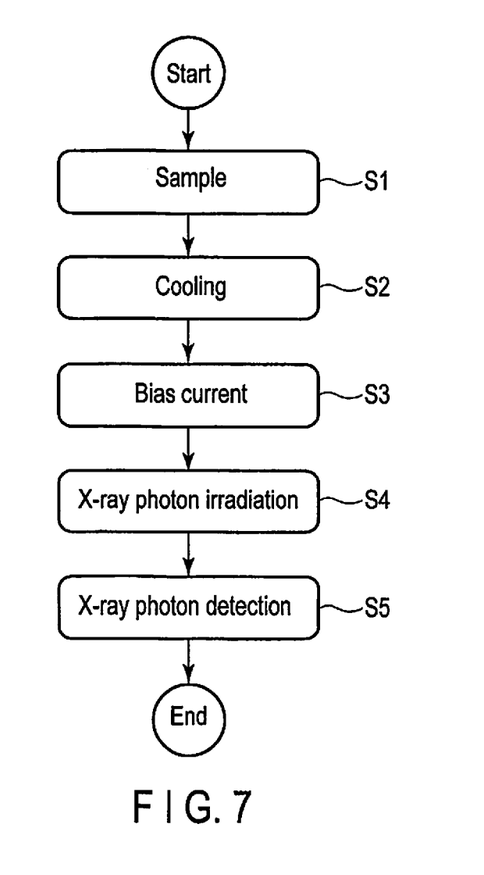
FIG. 7 is a flow chart for explaining a detection method of an X-ray photon according to an embodiment.

Next, a method of detecting an X-ray photon using the particle detection device of the present embodiment will be described with reference to a flow chart of FIG. 7.

As shown in FIG. 1, a sample 24 (for example, a semiconductor device) is disposed between the X-ray generator 23 and the slit portion 21 (step S1). Next, the superconducting strips 1 are cooled by the refrigerator to set superconducting strips 1 into a superconducting state (step S2). Next, the bias current Ib is supplied to the superconducting strips 1 (step S3), and in this state, the sample 24 is irradiated with the X-ray 22 generated by the X-ray generator 23, and a X-ray photon of the X-ray 22 penetrates the sample 24. Thereafter, the superconducting strips 1 is irradiated with the X-ray photon through the slit 20. The substrate surface 2 is usually perpendicular to the direction of incidence of a main X-ray generated by the X-ray generator 23. The bias current Ib is set to the extent that it is slightly less than the critical current, with which the superconducting state of the superconducting strips 1 is maintained.

Figure 3:
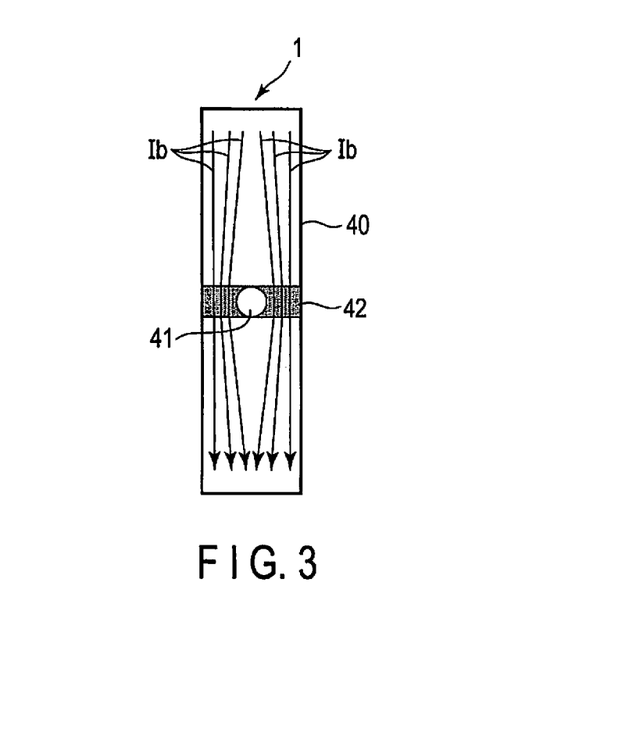
FIG. 3 is a diagram showing division of a superconducting region of the superconducting strip.

When the X-ray photon, which has penetrated the slit 20, is absorbed in the first portion 10 of the superconducting strips 11, as shown in FIG. 3, a region called a hot spot (hereinafter referred to as a hot spot region) 41, which transitions to a non-superconducting state, is generated in a superconducting region 40. Since the electrical resistance of the hot spot region 41 increases, the bias current Ib bypasses the hot spot region 41 and flows through another region (bypass region) 42 as shown in FIG. 3. Therefore, when the first portion 11 is irradiated with the X-ray photon, a state (divided state) in which the superconducting region of the first portion 11 is divided arises (step S4).

It has been known that if the cross sectional area of a superconducting strip is large, a superconducting region is not divided. Thus, the product of the dimension (thickness) in the second direction D2 and the dimension (width) in the third direction D3 of the first portion 11, that is, the cross sectional area of the first portion 11, is small to the extent that the above-described division of the superconducting region occurs. For example, the thickness of the first portion 11 is less than or equal to 200 nm, and the width of the first portion 11 is less than or equal to 200 nm. The same is true of the third portion 13, the fifth portion 15, and the seventh portion 17, which may absorb the X-ray photon.

Then, the region 42, which has transitioned to a non-superconducting state, rapidly disappears by being cooled, and thus, a pulsed electrical signal is generated by temporary electrical resistance generated by the division of the superconducting region 40. The pulsed electrical signal is amplified by the amplifier 32, and the number of X-ray photons (hereinafter, referred to as the X-ray photon number) is detected by counting the amplified pulsed electrical signal by using the measuring instrument 33 (step S5). Thus, the superconducting strips 1 can be used as pixels (particle detection portions) for detecting the X-ray photon number.

Here, also in cases where the X-ray photon is not absorbed in the first portion 11 of the superconducting strips but is transmitted therethrough, a pulsed electrical signal is similarly generated when the X-ray photon is absorbed in the third portion 13, the fifth portion 15, or the seventh portion 17, which is located under the first portion 11. Thus, the particle detection device of the present embodiment can improve in the detection efficiency of the X-ray photon.

The superconducting strips 1 of the present embodiment each comprise four particle detection portions (portions 11, 13, 15, and 17), but the number of particle detection portions may be two, three, five or more. In general, the greater the number of particle detection portions is, the higher the probability of the X-ray photon being absorbed in the superconducting strips 1 is. Accordingly, the detection efficiency improves. The probability is, for example, higher than 3.5%.

Since the particle detection device of the present embodiment has the structure in which the superconducting strips 1 are arranged at the optional pitch P1 in the third direction D3, a one-dimensional profile of the X-ray photon number can be acquired. The sample 24 can be evaluated on the basis of the one-dimensional profile. In addition, if the pitch P1 is made smaller, for example, if the pitch P1 is set to 100 nm, the size of a pixel can be set to a small value of 100 nm.

Furthermore, in the present embodiment, the X-ray photon number can be detected, even if particle detection portions, such as the first portion 11 and the third portion 13, are not made thicker. This leads to an improvement of detection efficiency without losing functionality of detection. In addition, even if the cross sectional area of the first portion 11, etc., is not increased, the pulsed electrical signal is generated. This also leads to an improvement of detection efficiency without losing functionality of detection.

In this manner, according to the present embodiment, it is possible to realize the particle detection device and the particle detection method employing the superconducting strips which are capable of improving the detection efficiency while reducing the size of a pixel. In addition, if a mechanism which scans the slit portion 21 in the first direction D1 and/or in the direction opposite to the first direction D1 is added, it is also possible to realize the particle detection device and the particle detection method which are capable of acquiring a two-dimensional profile of the X-ray photon number.

Second Embodiment

Figure 4:
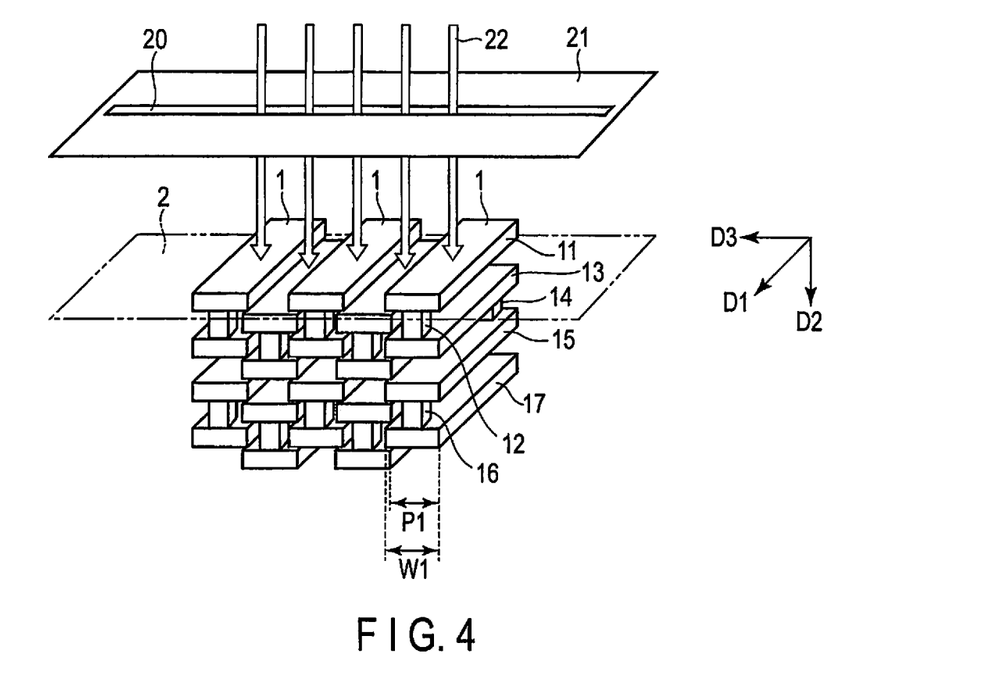
FIG. 4 is a perspective view showing a schematic structure of a particle detection device according to a second embodiment.

FIG. 4 is a perspective view showing a schematic structure of a particle detection device according to a second embodiment. In FIG. 4, for the sake of simplification, the number of superconducting strips 1 is five, and a sample and an X-ray light source are omitted.

In the particle detection device of the present embodiment, adjacent two superconducting strips 1 in a third direction D3 overlap each other with respect to a second direction D2. In other words, when the superconducting strips 1 are seen from above, there is no gap between the adjacent superconducting strips 1. The detection efficiency of an X-ray photon thereby can be further improved. It should be noted that the adjacent two the superconducting strips 1 do not contact each other.

To achieve the structure without the gap, the dimensions in the third direction D3 of a second portion 12, a fourth portion 14, and a sixth portion 16 are less than the dimensions (widths W1) in the third direction D3 of a first portion 11, a third portion 13, and a fifth portion 15. In addition, a pitch P1 is less than or equal to the widths W1. Moreover, in order that the adjacent two superconducting strips 1 do not contact each other, the positions of the superconducting strips 1 are alternately displaced with respect to the second direction D2.

Figure 5:
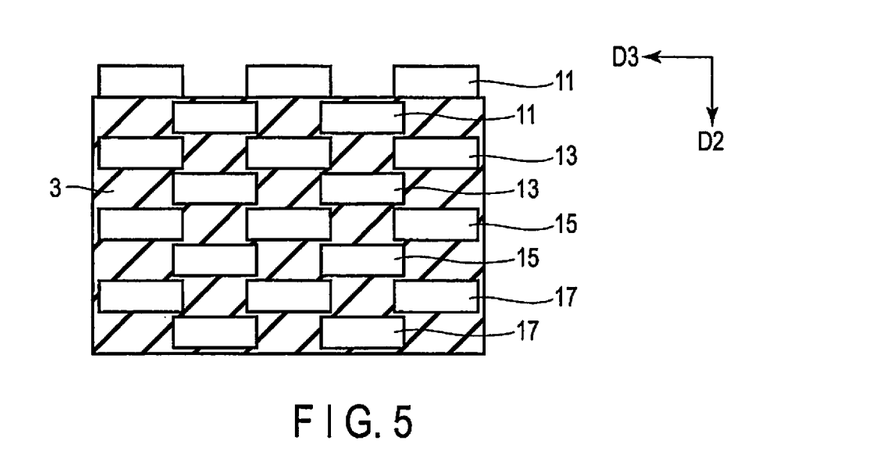
FIG. 5 is a sectional view of the particle detection device of FIG. 4.
Figure 6:
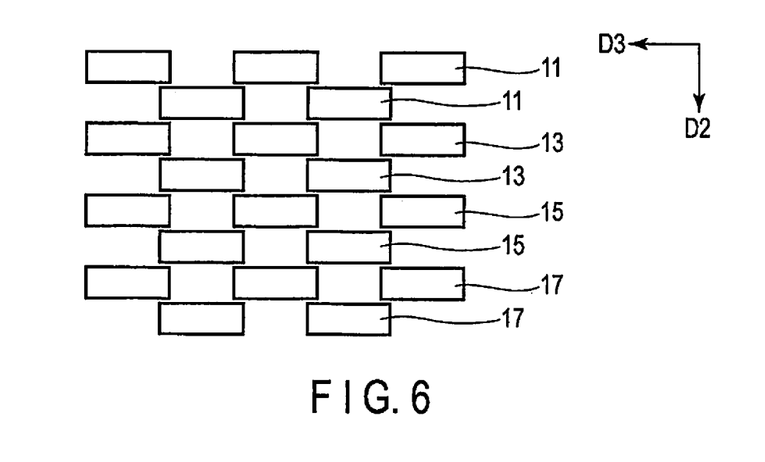
FIG. 6 is another sectional view of the particle detection device of FIG. 4.

FIG. 5 is a sectional view showing a section of the particle detection device of the present embodiment. An insulator 3 such as silicon dioxide is provided between the superconducting strips 1 in the substrate under the substrate surface 2. As shown in FIG. 6, the structure in which the insulator 3 is removed may be adopted.

In addition, while a plurality of superconducting strips are used to acquire a one-dimensional profile of the X-ray photon number in the particle detection devices of the above-described embodiments, the number of superconducting strips may be one depending on the purpose of the use of the particle detection devices.

While the superconducting strip, the particle detection device, and the particle detection method for detecting X-ray photons have been described in the above-described embodiments, the above-described embodiments are also applicable to the detection of other particles. For example, the above-described embodiments are also applicable to the detection of particles, such as extreme ultraviolet (EUV) photons, ultraviolet photons, infrared photons, visible light photons, electrons, neutrons, and ions.

In addition, the superconducting element is the superconducting stripes for detecting particle in the above-described embodiments, but the superconducting element may be used for other applications. In the present disclosure, the superconducting element is one that includes a superconducting portion configured to generate a division of a superconducting region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A superconducting element comprising at least one superconducting strip,
   the at least one superconducting strip comprising a meandering structure,
   the meandering structure comprising:
   a first portion extending in a first direction and made of a superconducting material, the first portion comprising a first surface that is to be irradiated with a particle, and a second surface that is opposite to the first surface;
   a second portion connected to the second surface of the first portion, extending in a second direction perpendicular to the first direction, and being conductive; and
   a third portion connected to the second portion, extending in a direction opposite to the first direction, and made of a superconducting material.

2. The superconducting element of claim 1, wherein the at least one superconducting strip is a plurality of superconducting strips.

3. The superconducting element of claim 2, wherein:
   the superconducting strips are arranged in a third direction perpendicular to the first direction and the second direction without contacting each other; and
   adjacent two superconducting strips of the superconducting strips do not overlap with respect to the second direction.

4. The superconducting element of claim 2, wherein:
   the superconducting strips are arranged in a third direction perpendicular to the first direction and the second direction without contacting each other; and
   adjacent two superconducting strips of the superconducting strips overlap with respect to the second direction.

5. The superconducting element of claim 1,
   further comprising:
   a fourth portion connected to the third portion, extending in the second direction, and being conductive; and
   a fifth portion connected to the fourth portion and extending in the first direction.

6. The superconducting element of claim 5, wherein the first portion, the second portion, the third portion, the fourth portion, and the fifth portion constitute the meandering structure.

7. The superconducting element of claim 6, wherein the first portion, the third portion, and the fifth portion overlap with respect to the second direction.

8. The superconducting element of claim 7, wherein:
   dimensions in the second direction of the first portion, the third portion, and the fifth portion are less than or equal to 200 nm;
   dimensions in the third direction of the first portion, the third portion, and the fifth portion are less than or equal to 200 nm.

9. The superconducting element of claim 8, wherein dimensions in the first direction of the first portion, the third portion, and the fifth portion are greater than dimensions in the second direction of the second potion and the fourth portion.

10. The superconducting element of claim 1, wherein the particle includes any one of an X-ray photon, an extreme ultraviolet photon, an ultraviolet photon, an infrared photon, a visible light photon, an electron, a neutron, and an ion.

11. A particle detection device comprising:
    a superconducting element used as a pixel for detecting a particle and comprising at least one superconducting strip;
    a current source which supplies a bias current to the at least one superconducting strip, and
    an amplifier connected to the at least one superconducting strip;
    the at least one superconducting strip comprising a meandering structure, the meandering structure comprising:
    a first portion extending in a first direction and made of a superconducting material, the first portion comprising a first surface that is to be irradiated with a particle, and a second surface that is opposite to the first surface;
    a second portion connected to the second surface of the first portion, extending in a second direction perpendicular to the first direction, and being conductive; and
    a third portion connected to the second portion, extending in a direction opposite to the first direction, and made of a superconducting material,
    wherein a superconducting region of any one of the first portion and the third portion is configured to be divided, and the particle is detected based on the divided state by using a measuring instrument that is provided in the particle detection device or out of the particle detection device.

12. The particle detection device of claim 11, wherein the at least one superconducting strip is a plurality of superconducting strips.

13. The particle detection device of claim 11, wherein the bias current is smaller than a critical current of a superconducting material of the at least one superconducting strip.

14. The particle detection device of claim 11, further comprising a measuring instrument which detects the particle based on a state in which the superconducting region is divided, and wherein the state arises in the at least one superconducting strip.

15. The particle detection device of claim 11, further comprising a refrigerator which cools the at least one superconducting strip and maintains a superconducting state of the at least one superconducting strip.

16. A particle detection method employing a superconducting element used as a pixel for detecting a particle, the superconducting element comprising at least one superconducting strip, a current source which supplies a bias current to the at least one superconducting strip, an amplifier connected to the at least one superconducting strip, each of the at least one superconducting strip comprising a meandering structure, the meandering structure comprising: a first portion extending in a first direction and comprising a superconducting material, the first portion comprising a first surface that is to be irradiated with a particle, and a second surface that is opposite to the first surface; a second portion connected to the second surface of the first portion, extending in a second direction perpendicular to the first direction, and being conductive; and a third portion connected to the second portion, extending in a direction opposite to the first direction, and comprising a superconducting material,
    the particle detection method comprising:

cooling the at least one superconducting strip to set the at least one superconducting strip into a superconducting state;

supplying a bias current to the at least one superconducting strip;

irradiating the at least one superconducting strip with a particle to set a superconducting region of the at least one superconducting strip into a divided state; and detecting the particle based on the divided state by using a measuring instrument.

17. The particle detection method of claim 16, wherein before irradiating the at least one superconducting strip with the particle, the particle penetrates a sample.

18. The particle detection method of claim 16, wherein the at least one superconducting strip is a plurality of superconducting strips.

19. The particle detection method of claim 16, wherein the bias current is smaller than a critical current of a superconducting material of the at least one superconducting strip.

20. The particle detection method of claim 16, wherein the particle includes any one of an X-ray photon, an extreme ultraviolet photon, an ultraviolet photon, an infrared photon, a visible light photon, an electron, a neutron, and an ion.

* * * * *